US007012275B2

(12) United States Patent
Balachandran et al.

(10) Patent No.: US 7,012,275 B2
(45) Date of Patent: Mar. 14, 2006

(54) METHOD FOR FABRICATION OF HIGH TEMPERATURE SUPERCONDUCTORS

(75) Inventors: Uthamalingam Balachandran, Hinsdale, IL (US); Beihai Ma, Naperville, IL (US); Dean Miller, Darien, IL (US)

(73) Assignee: The University of Chicago, Chicago, IL (US)

( * ) Notice: Subject to any disclaimer, the term of this patent is extended or adjusted under 35 U.S.C. 154(b) by 50 days.

(21) Appl. No.: 10/780,451

(22) Filed: Feb. 17, 2004

(65) Prior Publication Data

US 2005/0181953 A1    Aug. 18, 2005

(51) Int. Cl.
    *H01L 39/12*    (2006.01)
(52) U.S. Cl. .................. 257/33; 505/191; 505/193; 505/232
(58) Field of Classification Search ............... 505/191, 505/193, 232; 257/33
    See application file for complete search history.

(56) References Cited

U.S. PATENT DOCUMENTS

| 6,077,344 | A | * | 6/2000 | Shoup et al. .................. 117/9 |
| 6,361,598 | B1 | | 3/2002 | Balachandran et al. |
| 6,579,360 | B1 | | 6/2003 | Balachandran et al. |
| 2002/0022578 | A1 | * | 2/2002 | Schmidt et al. ............. 505/100 |
| 2003/0013613 | A1 | * | 1/2003 | Balachandran et al. ..... 505/100 |
| 2005/0039672 | A1 | * | 2/2005 | Selvamanickam et al. .... 117/89 |

OTHER PUBLICATIONS

B. Ma, M. Li, Y.A. Lee, R.E. Koritala, B.L. Fisher and U. Balachandran, Inclined-substrate Deposition of Biaxially Textured Magnesium Oxide Thin Films for YBCO Coated Conductors Physica C 366 (2002) 270-276.
B. Ma et al., "High Critical Current Density of YBCO Coated Conductors Fabricated by Inclined Substrate Deposition", Physica C 403 (2004) 183-190.
U. Balachandran, B. Ma, M. Li, B.L. Fisher and U. Balachandran, "Inclined Substrate Deposition of Biaxially Textured Magnesium Oxide Films for YBCO Coated Conductors", Physica C, 366, 270-276 (2002).
U. Balachandran, B. Ma, M. Li, B.L. Fisher, R.E. Koritala and D.J. Miller, "Development of Coated Conductors by Inclined Substrate Disposition", Advances in Cryogenic Engineering: ICMC, vol. 50, 2004, American Institute of Physics, 637-644.

* cited by examiner

*Primary Examiner*—Jerome Jackson
(74) *Attorney, Agent, or Firm*—Emrich & Dithmar LLC

(57) ABSTRACT

A layered article of manufacture and a method of manufacturing same is disclosed. A substrate has a biaxially textured MgO crystalline layer having the c-axes thereof inclined with respect to the plane of the substrate deposited thereon. A layer of one or more of YSZ or $Y_2O_3$ and then a layer of $CeO_2$ is deposited on the MgO. A crystalline superconductor layer with the c-axes thereof normal to the plane of the substrate is deposited on the $CeO_2$ layer. Deposition of the MgO layer on the substrate is by the inclined substrate deposition method developed at Argonne National Laboratory. Preferably, the MgO has the c-axes thereof inclined with respect to the normal to the substrate in the range of from about 10° to about 40° and YBCO superconductors are used.

22 Claims, 16 Drawing Sheets

METHOD FOR FABRICATION OF HIGH TEMPERATURE SUPERCONDUCTORS

CONTRACTUAL ORIGIN OF THE INVENTION

This work is supported by the U.S. Department of Energy (DOE), Energy Efficiency and Renewable Energy, as part of a DOE program to develop electric power technology, under Contract W-31-109-Eng-38.

BACKGROUND OF THE INVENTION

Biaxially aligned YBCO superconductors are desirable for high-current carrying applications. Growth of thin films that have the same crystalline orientation as their substrates or template films underneath is known as epitaxy growth. Three processes are widely recognized for producing biaxially aligned template for high-temperature superconductor fabrications. Ion beam assisted deposition (IBAD) and rolling assisted biaxially textured substrates (RABiTS) produce biaxially textured substrates with their c-axes normal to substrate surfaces. Thus a cube-on-cube epitaxial growth of buffer layers and YBCO films will produce c-axis normally aligned YBCO superconductors. The ISD (Inclined Substrate Deposition) process, as disclosed in U.S. Pat. No. 6,361,598 issued Mar. 26, 2002 and U.S. Pat. No. 6,579,360 issued Jun. 17, 2003, the entire disclosures of which are herein incorporated by reference, has many advantages when compared to IBAD or RABiTS. ISD does not require an assisting ion source and is independent of recrystallization properties of substrate materials. ISD is simple and fast, easy to scale up, and can deposit well-textured films on curved surfaces. However, these biaxially textured films produced by ISD are c-axis inclined with respect to the substrate normal. B. Ma, M. Li, Y. A. Jee, B. L. Fisher, and U. Balachandran, "*Inclined Substrate Deposition of Biaxially Textured Magnesium Oxide Films for YBCO Coated Conductors,*" *Physica C*, 366, 270–276 (2002). The challenge is to fabricate c-axis normally aligned superconductors on the c-axis inclined ISD type substrates. However, in order to accomplish this goal, the cube-on-cube epitaxial relation must be violated. By using YSZ and $CeO_2$ buffer layers, we successfully deposited biaxially aligned YBCO films with c-axis normal to substrate surface in the ISD process. YBCO films deposited on ISD platform are similar to these made on IBAD or RABiTS substrates. We have measured $J_c \approx 1.2$ $MA/cm^2$ on YBCO deposited on ISD MgO platform using YSZ and $CeO_2$ buffer layers. U. Balachandran, B. Ma, M. Li, B. L. Fisher, R. E. Koritala, and D. J. Miller, "*Development of Coated Conductors by Inclined Substrate Deposition,*" submitted to the 2003 Cryogenic Engineering Conference and International Cryogenic Materials Conference (CEC/ICMC 2003), Anchorage, Ak., Sep. 22–26, 2003.

SUMMARY OF THE INVENTION

It is an object of the present invention to provide an article of manufacture and a method of making same in which a biaxially aligned c-axes inclined MgO platform supported on a substrate, which may or may not be biaxially aligned, also supports a superconductor with the c-axes normally aligned to the substrate.

Another object of the present invention is to provide an article of manufacture and method of making same in which a biaxially textured MgO film is deposited by the Inclined Substrate Deposition process and serves to support a crystalline superconductor film having a $J_c$ equal to or better than $J_c$ of superconductors deposited on MgO films having the c-axes thereof normal to the substrate.

Still another object of the present invention is to provide a layered article of manufacture of a substrate; a biaxially textured MgO crystalline layer having the C-axes thereof inclined with respect to the substrate normal; a layer of one or more of YSZ or $Y_2O_3$; a layer of $CeO_2$; and a crystalline superconductor layer, the crystalline superconductor having the c-axes thereof normal to the substrate plane.

Still another object of the present invention is to provide a layered article of manufacture of a metallic substrate; biaxially textured MgO crystalline layer on the metallic substrate, the MgO having the c-axes thereof inclined with respect to the normal to the plane of substrate in the range of from about 10° to about 40°; a layer of one or more of YSZ or $Y_2O_3$ on the MgO crystalline layer; a layer of $CeO_2$ on the layer of one or more of YSZ or $Y_2O_3$; and a crystalline superconductor layer on said $CeO_2$ layer, the crystalline superconductor having the c-axes thereof normal to the metallic substrate plane.

A still further object of the invention is to provide a method of making a layered article of manufacture by providing a substrate; depositing a biaxially textured MgO crystalline layer on the substrate by the inclined substrate deposition method, the MgO having the c-axes thereof inclined with respect to the plane of the substrate; depositing a layer of one or more of YSZ or $Y_2O_3$ on the biaxially textured MgO crystalline layer; depositing a layer of $CeO_2$ on the layer of one or more of YSZ or $Y_2O_3$; and depositing a crystalline superconductor layer on the $CeO_2$ layer, the crystalline superconductor having the c-axes thereof normal to the substrate plane.

BRIEF DESCRIPTION OF THE DRAWINGS

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

FIGS. 5(*c*) is a plan-view and 5(*d*) is a cross-section SEM images of MgO film after depositing an additional layer of MgO e-beam evaporated at 700° C. with $\alpha=0°$;

DESCRIPTION OF PRESENT INVENTION

Figure 1:
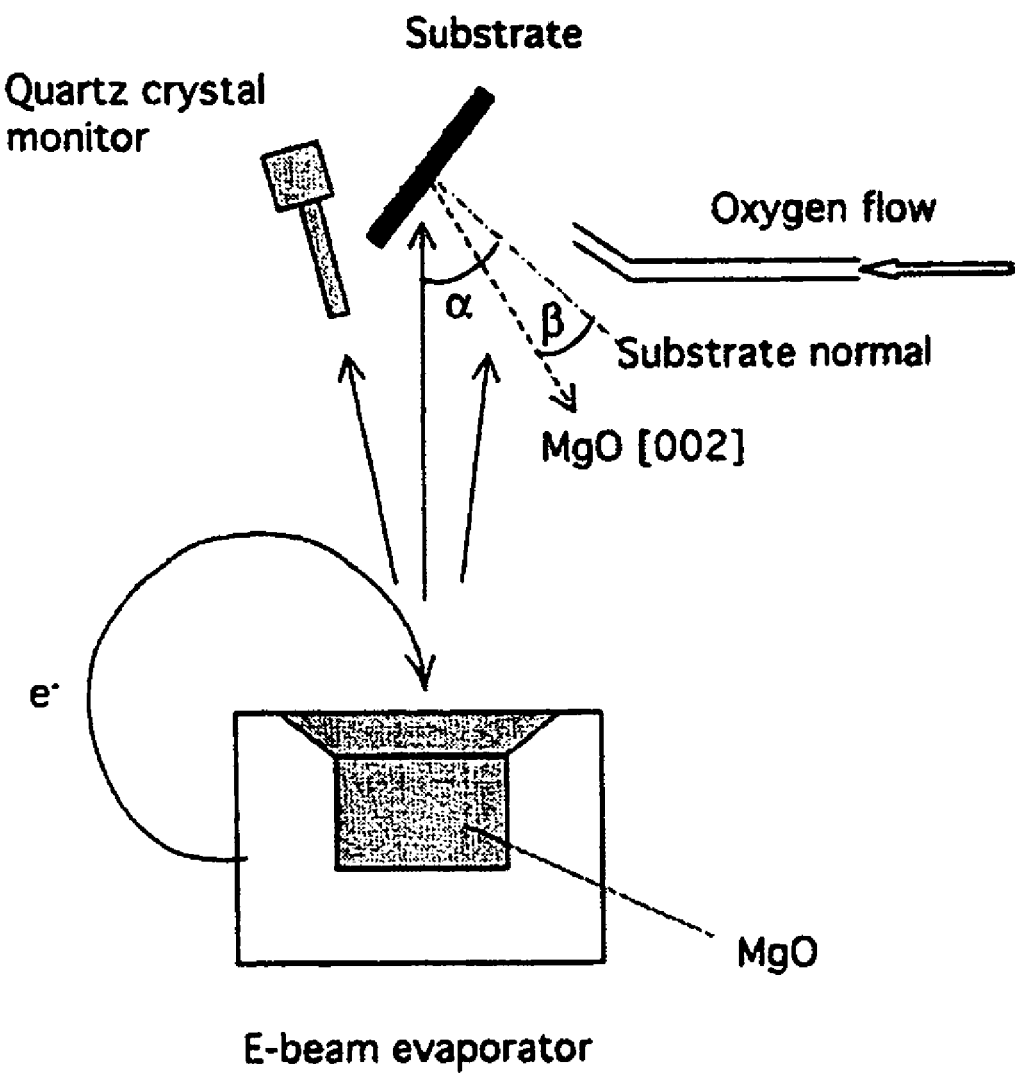
FIG. 1 is a schematic illustration of an experimental set-up for the ISD method of depositing an MgO film.

It should be noted at the outset, that although the invention is hereafter described with respect to depositing a YBCO superconductor, it is not so limited. Any crystalline superconductor can be used in the present invention, particularly superconductors such as the entire YBCO family of oxide superconductors, the BSCCO family of superconductors; the TBSCCO family of oxide superconductors and the HBSCCO family of oxide superconductors, as disclosed in the aforementioned 'incorporated '360 patent.

In addition, although the substrates herein described are metallic substrates and preferably nickel alloy substrates, it is not intended to so limit the invention which includes ceramic substrates as well as metallic substrates. For instance, in the aforementioned and incorporated '598 patent, substrates of silicon dioxide are disclosed and various nickel based alloys such as nickel chromium or nickel vanadium alloys are disclosed. Moreover, although the biaxially textured magnesium oxide is deposited in the hereafter examples by an electron beam evaporator, other methods may also be used with the ISD process such as but not limited to the pulse laser deposition method.

Finally, although yttria stabilized zirconia (YSZ) is disclosed intermediate the biaxially textured magnesium oxide layer and the ceria layer, yttrium oxide ($Y_2O_3$) is also an acceptable material.

Biaxially textured magnesium oxide (MgO) films deposited by ISD are desirable for rapid production of high-quality template layers for YBCO-coated conductors. High quality YBCO films were grown on ISD MgO buffered metallic substrates by pulsed laser deposition (PLD). Columnar grains with a roof-tile surface structure were observed in the ISD MgO films. X-ray pole figure analysis revealed that the (002) planes of the ISD MgO films are titled at an angle from the substrate normal. A small full-width at half maximum (FWHM) of ≈9° was observed in the φ-scan for ISD MgO films deposited at an inclination angle of 55°. In-plane texture in the ISD MgO films developed in the first ≈0.5 μm from the substrate surface, then stabilized with further increases in film thickness. Yttria-stabilized zirconia and ceria buffer layers were deposited on the ISD MgO grown on metallic substrates prior to the deposition of YBCO by PLD. YBCO films with the c-axis parallel to the substrate normal have a unique orientation relationship with the ISD MgO films. An orientation relationship of YBCO<100>//MgO<111> and YBCO<010>//MgO<110> was measured by X-ray pole figure analyses and confirmed by transmission electron microscopy. A $T_c$ of 91 K with a sharp transition and transport $J_c$ of $1.2 \times 10^6$ $A/cm^2$ at 77 K in self-field were measured on a YBCO film that was 0.40-μm thick, 4-mm wide, and 10-mm long.

We grew biaxially textured MgO thin films on mechanically polished Hastelloy C276 (HC) substrates by ISD with an electron beam (e-beam) evaporation system. Yttria-stabilized zirconia (YSZ) and ceria ($CeO_2$) buffer layers, as well as YBCO films, were subsequently deposited on ISD-MgO-buffered metallic substrates by pulsed laser deposition (PLD). Surface morphology was investigated by scanning electron microscopy (SEM), and surface roughness was measured by atomic force microscopy (AFM). The crystalline orientation of the films was studied by transmission electron microscopy (TEM). X-ray pole figures, as well as φ- and w-scans, were used to analyze film texture.

Figure 2:
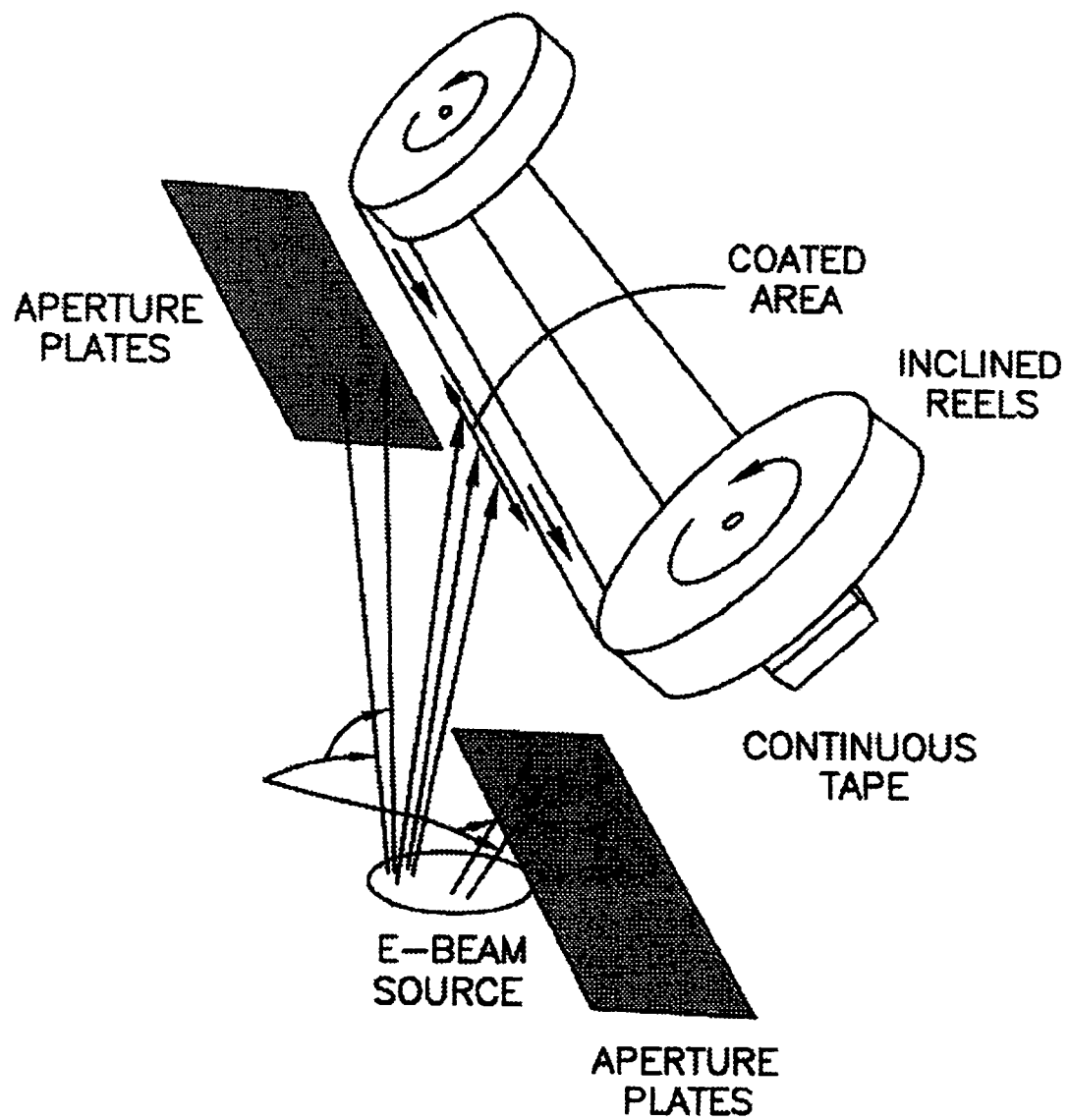
FIG. 2 is a schematic illustration of the inclined substrate deposition of the present invention.

Mechanically polished HC coupons measuring ≈0.1-mm thick, ≈5-mm wide, and 1-cm long were used as substrates for the depositions of ISD MgO template films, YSZ and $CeO_2$ buffer layers, and YBCO films. A root-mean-square (RMS) surface roughness of 2–3 nm was measured by AFM on HC substrates that were polished to a mirror finish with 0.25-μm diamond paste. For comparison studies, we also prepared substrates of various surface roughnesses, up to a RMS value of ≈15 nm, by use of finishing polish in different sizes of grinding media. Schematic illustrations of the experimental setup for the ISD process is shown in FIGS. 1 and 2 and were previously described in the '598 and '360 patents. MgO thin films were grown from an MgO source by e-beam evaporation. Fused lumps of MgO (Alfa Aesar, 99.95% metals basis, 3–12 mm pieces) were used as the target material. The substrates were mounted on a tiltable sample stage above the e-beam evaporator. The substrate inclination angle α (substrate normal with respect to the evaporation direction) was ≈55°. High-purity oxygen flow was introduced into the system at ≈3 sccm during film deposition. The base pressure of the vacuum system was $1 \times 10^{-7}$ torr, which rose to ≈$2 \times 10^{-5}$ torr during deposition. A quartz crystal monitor was mounted beside the sample stage to monitor and control the deposition rate. High deposition rates of 20–100 Å/sec were used, and the substrate temperature was maintained between room temperature and 50° C.

during deposition. After the deposition of ISD films, a dense thin layer of MgO was deposited at a zero-degree inclination angle at elevated temperature (≈700° C.). This layer of MgO film has the same crystalline texture as the ISD MgO film underneath, and is thus referred as a homoepitaxial MgO layer.

The α angle in ISD is between the plume of MgO ions and a normal to the plane of the substrate and may vary in the range of from about 10° to about 70° with the preferred angles being 35°±10° or 60°±10°. The β angle in ISD is between the c-axes of the MgO layer deposited by ISD and a normal to the plane of the substrate and may vary in the range of from about 10° to about 40° with the preferred angles being between about 20° to about 35°. In the ISD process, the α angle is pertinent to the method of deposition while the β angle is used herein when describing the article produced by ISD.

Figure 4:
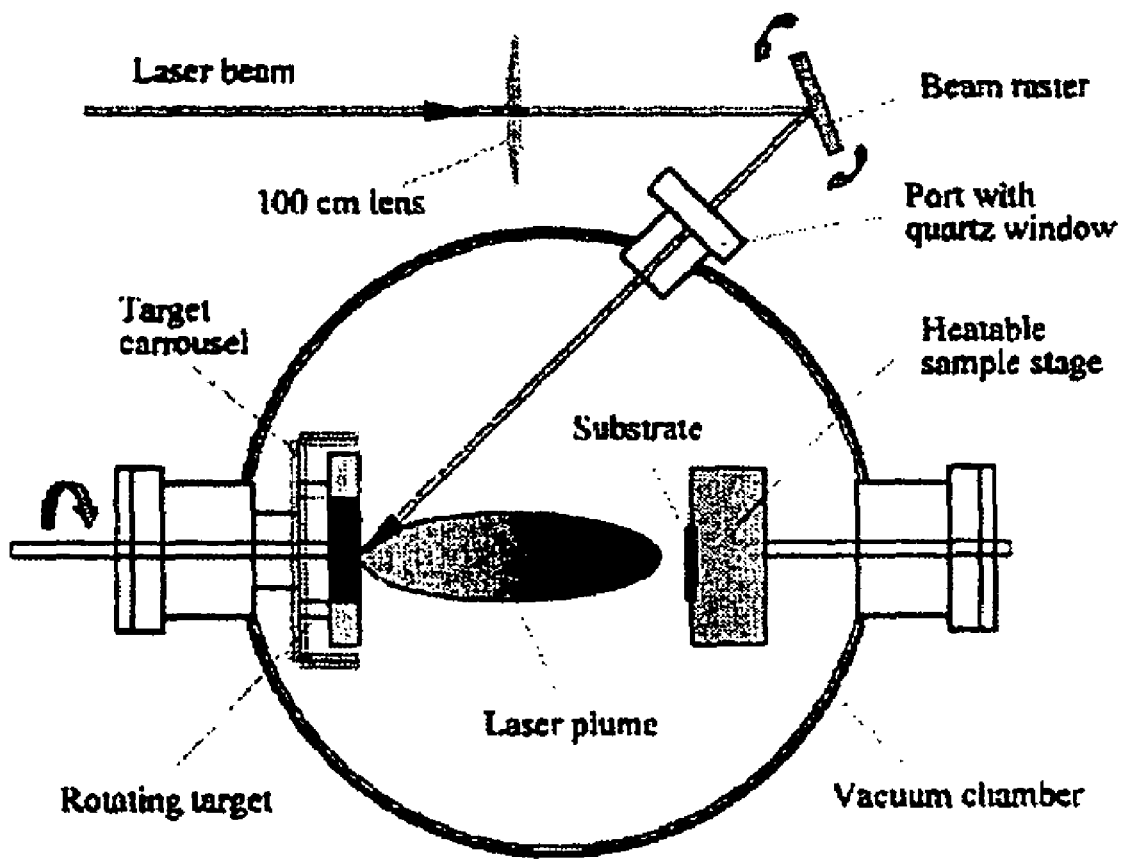
FIG. 4 is a schematic illustration of the pulsed laser deposition (PLD) system.

Buffer layers and YBCO films were deposited by PLD using a Lambda Physik LPX 210i excimer laser, with a Kr—$F_2$ gas premixture as the lasing medium. FIG. 4 shows a schematic illustration of the PLD system. This PLD system has an optical beam raster to produce films with better uniformity over a broader area. The laser beam is focused at the target through a quartz lens (1000 mm focal length) coated with anti-reflective coating, and is reflected by a mirror that is mounted as part of the beam raster. The reflected beam hits the target at a 45° incident angle. The rotating target carrousel carries four targets to accommodate the needs for multiple layer ablation without breaking vacuum.

Commercial targets (Superconductive Components, Inc. 99.999% pure), 45 mm in diameter and 6 mm thick, were used. Substrates were attached to a heatable sample stage with silver paste and heated to a high temperature (700–800° C.) during deposition. The base pressure of the PLD chamber was ≈1×10$^{-5}$ torr. The desired operating pressure (100–300 mtorr) was maintained by flowing ultra-high-purity oxygen at ≈10 sccm and pumping the chamber with a molecular turbo pump. The size of the laser spot focused at the rotating target was ≈12 mm$^2$, which produced an energy density of ≈2.0 J/cm$^2$. The distance between the target and the substrates was ≈7 cm. The superconducting critical transition temperature ($T_c$) and $J_c$ were determined by the inductive method, and the transport $J_c$ was measured by the four-point transport method at 77 K in liquid nitrogen using a 1 μV/cm criterion. The inductive method has been used as a standard characterization tool to measure the superconducting properties of YBCO films. Thin-film superconductor samples were placed between a pair of primary and secondary coils with inner diameters of ≈1 mm and outer diameters of ≈5 mm. An alternating current of 1 kHz was introduced to the primary coil and detected from the secondary coil by a lock-in amplifier (Stanford Research Systems SR830 DSP). Samples used for transport measurements were first coated with 2-μm-thick silver by e-beam evaporation and then annealed in flowing high-purity oxygen at 400° C. for 2 h.

Film texture was characterized by X-ray diffraction and pole figure analysis with Cu—$K_α$ radiation. For the ISD MgO films and the subsequently deposited buffer films, in-plane texture was characterized by the full-width at half maximum (FWHM) of the φ-scan for the (002) reflection, and out-of-plane texture was characterized by the FWHM of the ω-scan at the [001] pole for the same reflection. As for the YBCO films, in-plane texture was measured by the FWHM of the YBCO (103) φ-scan, and out-of-plane texture was measured by the FWHM of the YBCO (005) ω-scan.

Plan-view and fracture cross-sectional SEM (Hitachi S-4700-II) were conducted to study the film morphology. Surface roughness was measured by taping mode AFM with a Digital Instruments Dimension 3100 SPM system. TEM (Philips CM30) was conducted to study crystalline orientation relationships among the ISD MgO template, YSZ and CeO$_2$ buffer, and YBCO films.

Figure 5A:
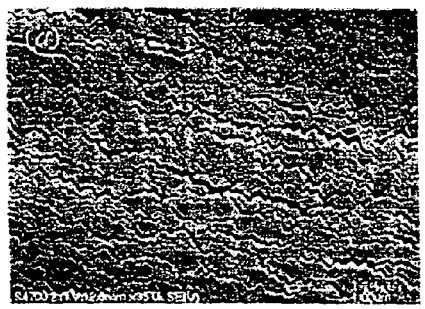
FIGS. 5(*a*) is a plan view and 5(*b*) is a cross-section SEM image of ISD MgO film deposited at room temperature with $\alpha=55°$.
Figure 5B:
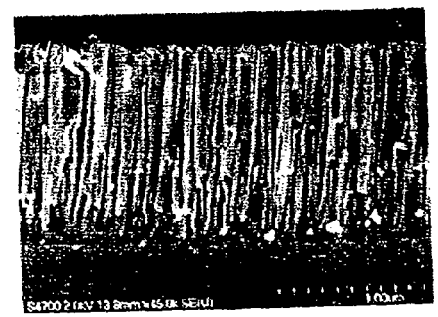
Figure 5C:
Figure 5D:
Figure 6A:
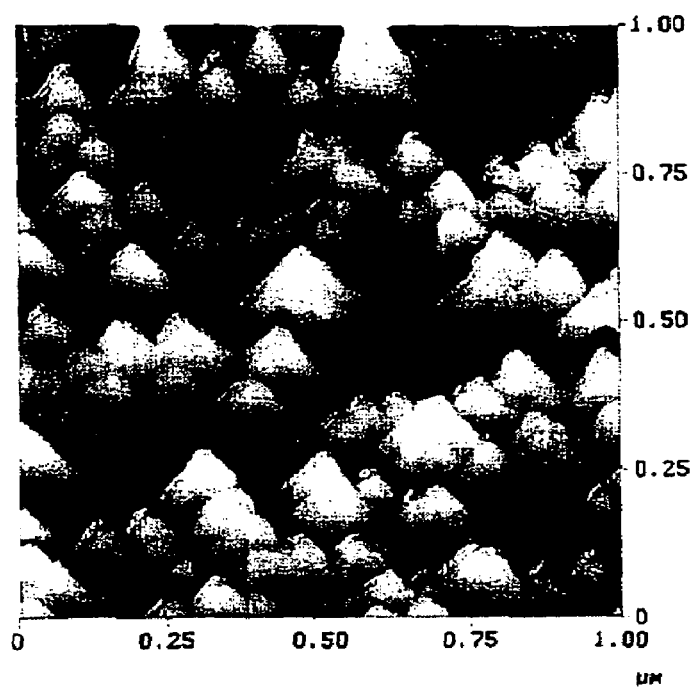
FIG. 6 is an AFM image of (a) ISD and (b) homoepitaxial MgO films.
Figure 6B:
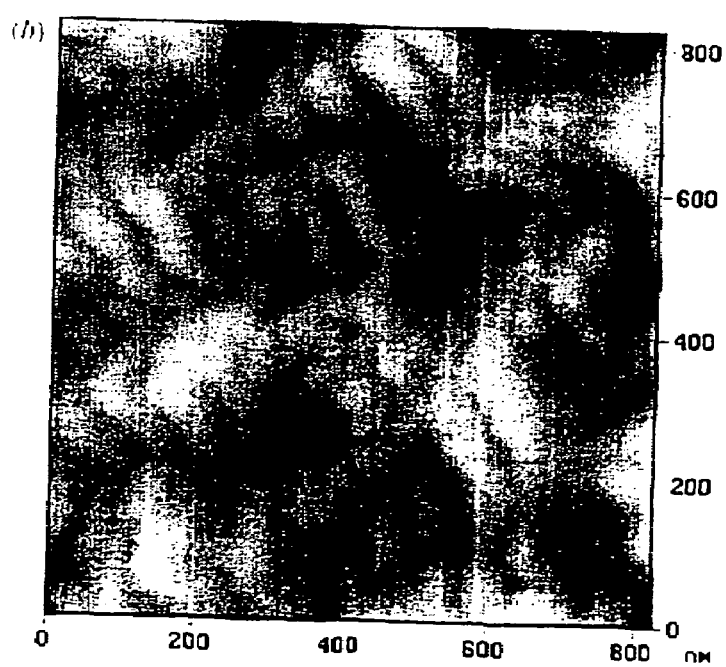

Plan-view SEM revealed FIG. 5(a) a roof-tile structure for the ISD MgO film deposited at room temperature with α=55°. Columnar grains nearly perpendicular to the substrate surface were observed on the cross-sectional fracture surface (FIG. 5b). The MgO grain size increased when the film grew for the first 0.5-μm thickness; it then became stabilized at ≈0.2 μm, without noticeable change in size when the film grew thicker. To reduce surface roughness, an additional thin layer of MgO was deposited on the ISD MgO films at elevated temperatures (600–800° C.) by e-beam evaporation with α=0. FIGS. 5c and 5d are SEM images of the top plan-view and fracture cross-sectional view of a 0.5-μm-thick homoepitaxial MgO layer deposited on 1.5-μm-thick ISD MgO at 700° C. Plate-shaped grains were formed during the homoepitaxial deposition at 700° C., in contrast to columnar grains during ISD deposition at room temperature, as shown in FIG. 5d. Surface smoothness of the film was improved after the deposition of a homoepitaxial MgO layer on an ISD film. FIG. 6 shows the AFM images of ISD MgO films with and without a homoepitaxial MgO layer. AFM analysis revealed that the RMS surface roughness of the MgO films improved from ≈28 nm to ≈9 nm after deposition of the homoepitaxial layer.

Figure 7A:
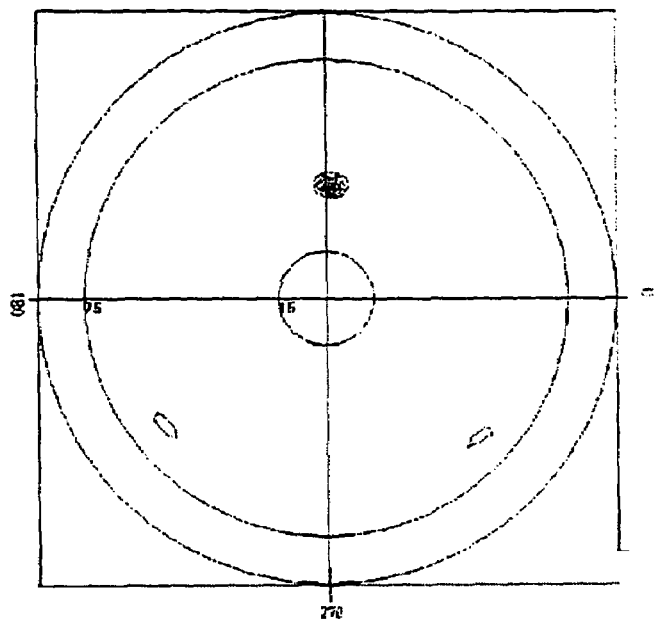
FIGS. 7(*a*) is a MgO (002) and 7(*b*) is a MgO(220) illustration pole figures for an ISD MgO film deposited at room temperature with $\alpha=55°$.
Figure 7B:
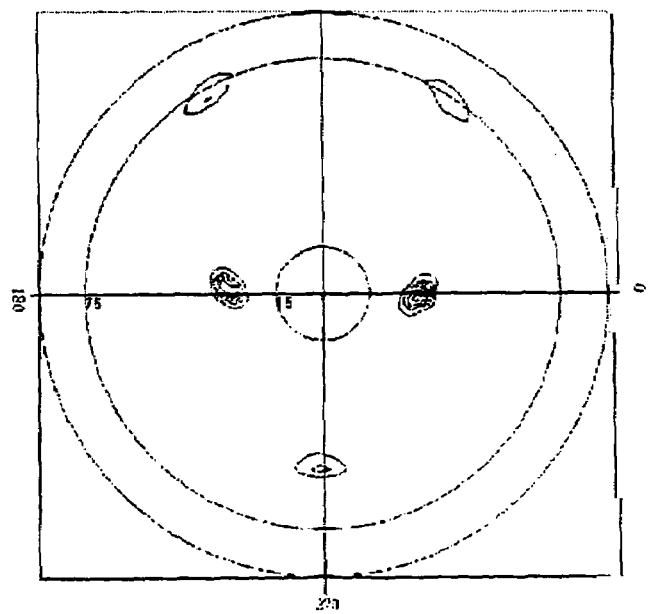

Typical X-ray pole figures of an ISD MgO film deposited with an inclination angle of 55° are shown in FIGS. 7(a) and (b). Unlike the YSZ films prepared by inclined-substrate PLD [10], where the (001) planes are nearly parallel to the substrate surface, the [001] axis of the ISD MgO buffer layer is tilted away from substrate normal. The asymmetric distribution of the pole peaks reveals that the MgO (001) planes have a tilt angle β toward the deposition direction. These ISD MgO films exhibit good texture. Distinct in-plane alignment can be seen by the well-defined poles for not only the [001] axis but also the [010] and [100] axes in FIGS. 7(a) and (b).

Out-of-plane alignment was characterized by the ω-scan; data were taken at the [001] pole. The tilt angle, as determined from the chi angle value of the [001] reflection in the MgO (002) pole figure, was ≈32°. TEM/selected area diffraction on the ISD MgO films confirmed that the top surface of an MgO columnar grain was terminated with a (002) plane; and MgO [002] was ≈32° with respect to substrate normal, see 11. U. Balachandran, B. Ma, M. Li, B. L. Fisher, R. E. Koritala, R. Erck, and S. E. Dorris, "*Fabrication by Inclined-Substrate Deposition of Biaxially Textured Buffer Layer for Coated Conductors,*" Proceedings of Materials Research Society Fall 2001 Meeting, Boston, Nov. 25–29, 2001. Tilt angle β increased with increasing inclination angle α, as reported earlier, see B. Ma, M. Li, Y. A. Jee, B. L. Fisher, and U. Balachandran, "*Inclined Substrate Deposition of Biaxially Textured Magnesium Oxide Films for YBCO Coated Conductors,*" Physica C, 366, 270–276 (2002).

Figure 8A:
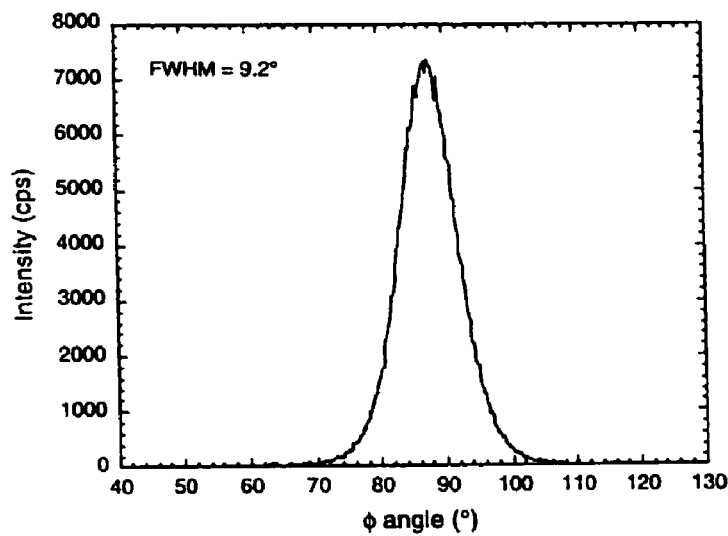
FIG. 8(*a*)-(*b*) are graphical illustrations showing the MgO (002) $\phi$-scan and $\omega$-scan patterns after homoepitaxially growth of 0.5 μm thick MgO layer on an ISD MgO film at an elevated temperature.
Figure 8B:
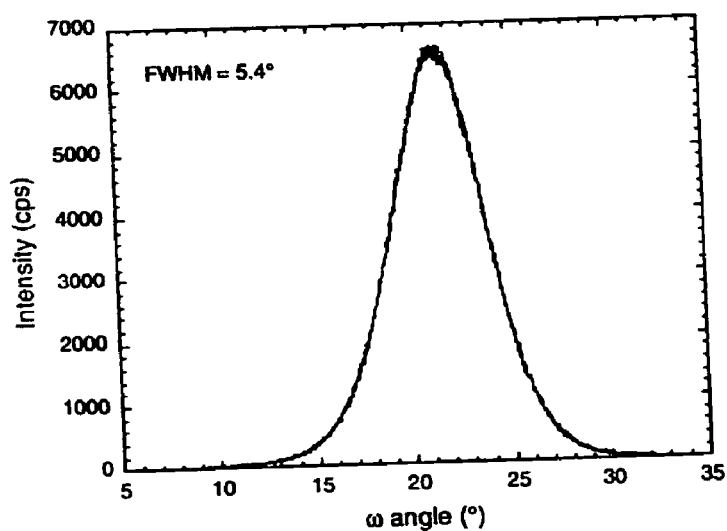

FIGS. 8(a) and (b) shows the φ- and ω-scan patterns for MgO (002) after homoepitaxially growing a 0.5-μm-thick MgO layer on a ≈1.5 μm ISD MgO film at elevated temperature. FWHMs of 9.2 and 5.4° were observed in the MgO (002) φ-scan and ω-scan, respectively.

Figure 9:
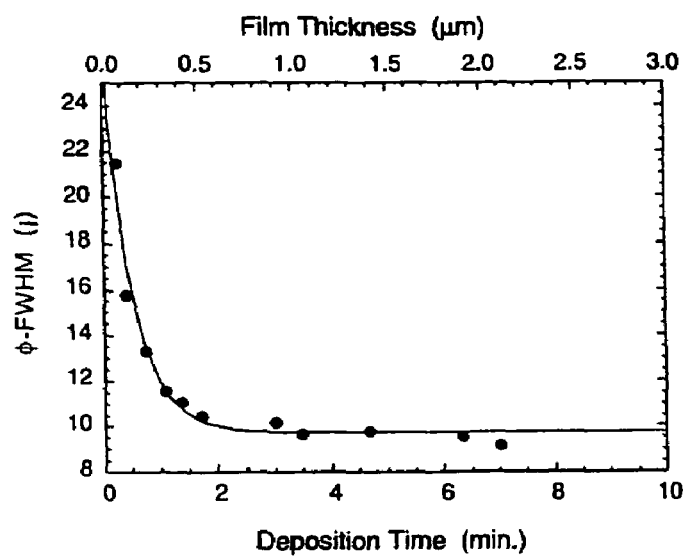
FIG. 9 is a graphical illustration of a texture development in the ISD MgO film.
Figure 10:
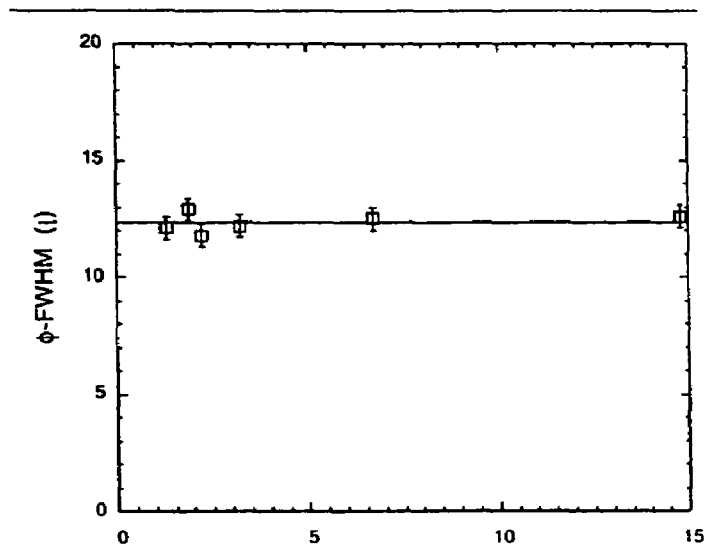
FIG. 10 is a graphical illustration of an in-plane texture as a function of substrate surface roughness for ISD MgO films of 2 μm thickness.
Figure 11A:
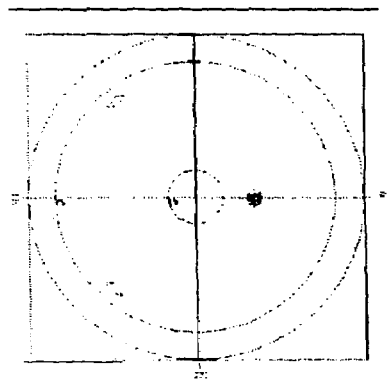
FIG. 11(a) is a graphical illustration showing the x-ray pole figures for MgO (002) showing the cube-on-cube epitaxial relationship among $CeO_2$, YSZ buffer layers and ISD MgO film underneath.
Figure 11B:
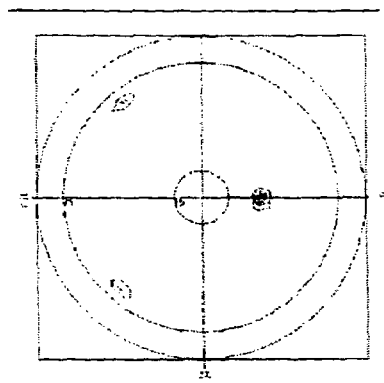
FIG. 11(b) is a graphical illustration showing the x-ray pole figures for YSZ (002) showing the cube-on-cube epitaxial relationship among $CeO_2$, YSZ buffer layers and ISD MgO film underneath.
Figure 11C:
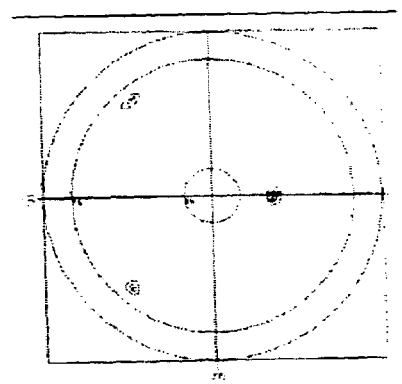
FIG. 11(c) is a graphical illustration showing the x-ray pole figures for $CeO_2$ (002) showing the cube-on-cube epitaxial relationship among $CeO_2$, YSZ buffer layers and ISD MgO film underneath.

To study the thickness dependence of texture development in ISD MgO films, we first deposited ISD MgO films of various thicknesses followed by deposition of a ≈0.5 μm homoepitaxial MgO layer at 700° C. FIG. 9 shows the in-plane texture as a function of ISD MgO layer thickness measured by X-ray φ-scan. In the first 0.5 μm, the φ-scan FWHM decreases rapidly with increasing film thickness; it then stabilizes at ≈9°. Roughly ≈1.5 min is required to fully develop the desired texture at a deposition rate of 50 Å s$^{-1}$. Film texture is independent of substrate surface roughness up to an RMS surface roughness of 15 nm for ISD MgO films of ≈2-μm thickness, as shown in FIG. 10. YSZ and $CeO_2$ Buffer Layers YSZ and $CeO_2$ films were epitaxially grown on top of the homoepitaxial MgO film by PLD using the conditions listed in Table 1. Layer thicknesses for the YSZ and $CeO_2$ are ≈200 nm and ≈10 nm, respectively. Both $CeO_2$ and YSZ layers have a cube-on-cube epitaxial relationship with the ISD MgO template film. FIGS. 11(a)–(c) show (002) pole figures for MgO, YSZ, and $CeO_2$ layers. A cube-on-cube epitaxial relationship was observed, with $CeO_2$<100>‖YSZ<100>‖MgO<100> and $CeO_2$<010>‖YSZ<010>‖MgO<010> or $CeO_2$<001>‖YSZ<001>‖MgO<001>. This epitaxial relationship was confirmed by TEM studies, see B. Ma et al., "High Critical Current Density of YBCO Coated Conductors Fabricated by Inclined Substrate Deposition" to be submitted to *Physica C*, (2004).

The c-axes for both YSZ and $CeO_2$ buffer films are tilted at the same angle (≈32°) as the ISD MgO template film. (002) φ-scan FWHMs of 9.2, 8.8, and 8.0° were measured for MgO, YSZ, and $CeO_2$, respectively.

TABLE 1

Conditions used for epitaxial growth of YSZ and $CeO_2$ buffer layers by PLD

| | |
|---|---|
| Laser wavelength | 248 nm (Kr-F) |
| Repetition rate | 2–8 Hz |
| Pulse width | 25 ns |
| Energy density | 1–3 J/cm$^2$ |
| Substrate temperature | 700–800° C. |
| Operating pressure | 1–100 mTorr |
| Oxygen flow rate | 1–10 sccm |
| Target-to-substrate distance | 4–8 cm |

Figure 12A:
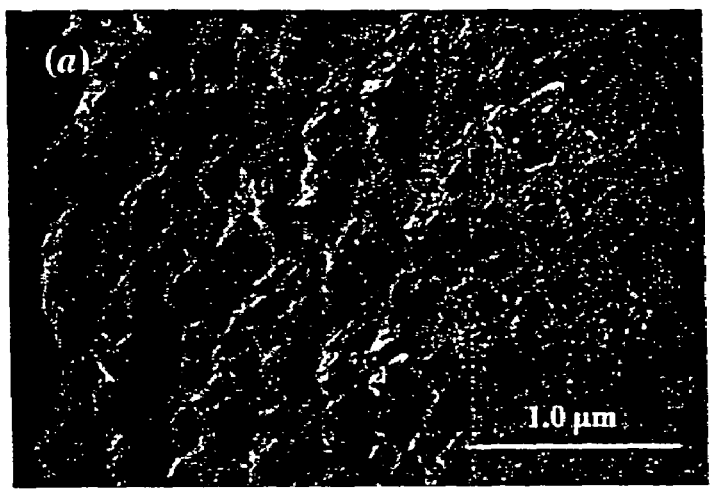
FIG. 12(a) is a plan view SEM image of a YSZ buffer layer deposited on an ISD MgO template film.
Figure 12B:
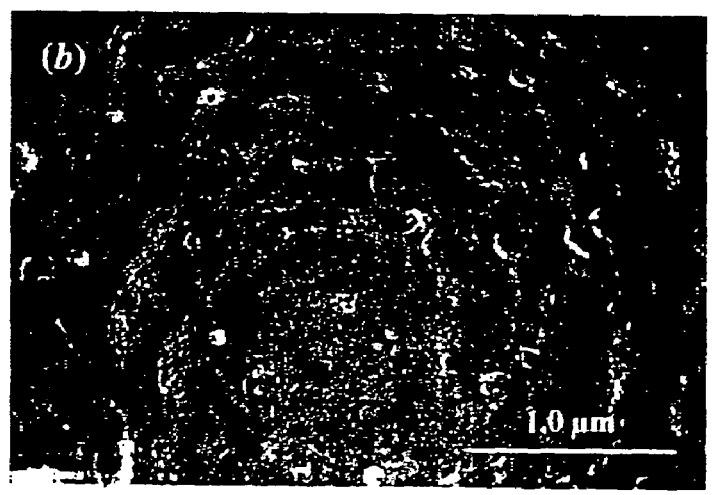
FIG. 12(b) is a plan view SEM image of a $CeO_2$ buffer layer deposited on an ISD MgO template film.

FIGS. 12(a) and (b) show plan-view SEM images of the YSZ and $CeO_2$ buffer layers grown on an ISD MgO template film. We observed "roof-tile" morphology on the surface of YSZ films, shown in FIG. 12a, similar to that observed on the ISD MgO film. However, after deposition of the $CeO_2$ layer, the "roof tile" feature was hardly visible from the SEM image (FIG. 12b). Film surface roughness was further improved. RMS roughness of ≈8 nm was measured on both YSZ and $CeO_2$ films by AFM. Some defects, pits and pimples, were observable on the surface of $CeO_2$ films deposited by PLD. These defects may have affected the superconducting properties of the YBCO film deposited on top of it. Further studies will be conducted.

Figure 13A:
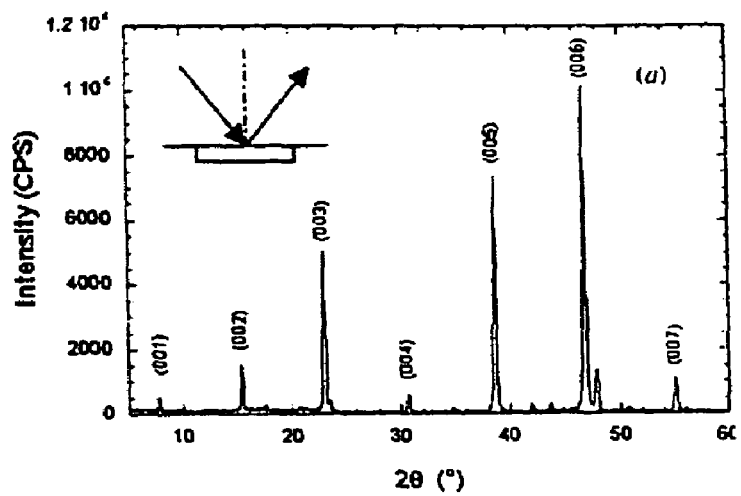
FIG. 13(a) is a graphical x-ray diffraction pattern at normal arrangement pole.
Figure 13B:
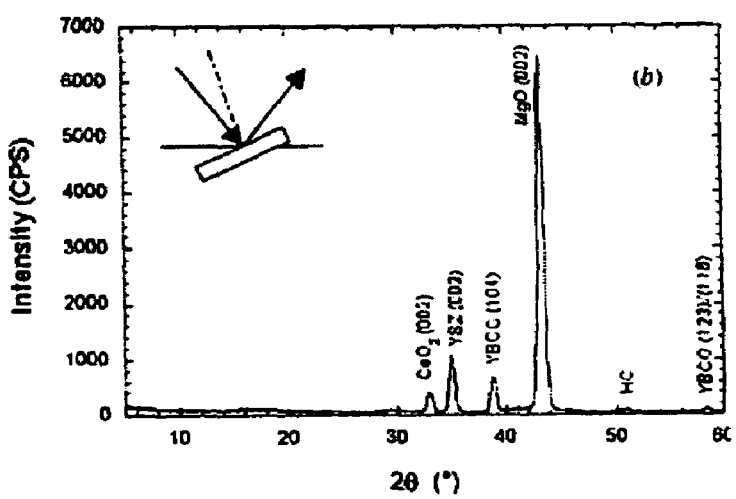
FIG. 13(b) is a graphical x-ray diffraction pattern at MgO (002)

FIGS. 13(a) and (b) show X-ray θ-2θ diffraction patterns for the YBCO films deposited on YSZ and $CeO_2$ buffered ISD MgO substrates. The X-ray diffraction pattern measured with normal orientation is shown in FIG. 11(a). Only YBCO (001) peaks were observable; this finding indicated that the c-axis of the YBCO film is parallel to the substrate normal. No diffraction peaks from MgO, YSZ, or $CeO_2$ were observed in FIG. 13a because these layers have a tilted structure; thus, the Bragg diffraction condition was not satisfied for these layers. (002) peaks for MgO, YSZ, and $CeO_2$ were observed from an X-ray θ-2θ diffraction pattern taken at the strongest MgO (002) pole by tilting and rotating the sample to appropriate angles before the 2θ-scan, as shown in FIG. 13b.

Figure 14A:
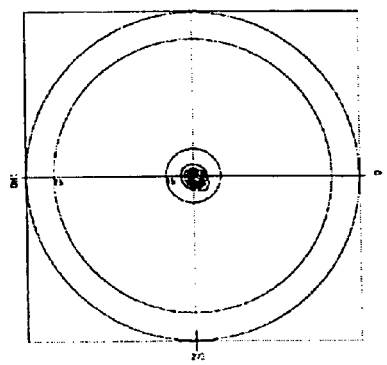
FIG. 14(a) is an illustration of the x-ray pole figure for YBCO (005) measured on the same sample.
Figure 14B:
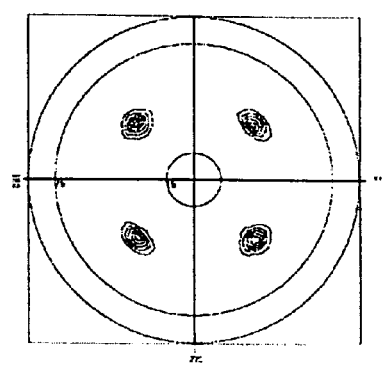
FIG. 14(b) is an illustration of the x-ray pole figure for YBCO (103) measured on the same sample.
Figure 14C:
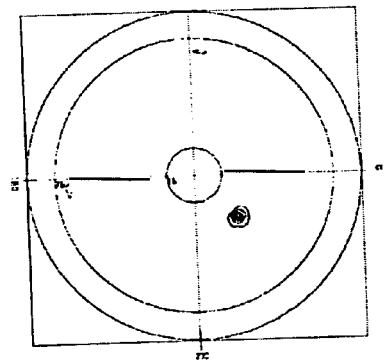
FIG. 14(c) is an illustration of the x-ray pole figure for MgO (002) measured on the same sample.
Figure 14D:
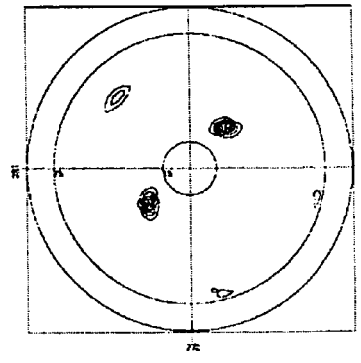
FIG. 14(d) is an illustration of the x-ray pole figure for MgO (220) measured on the same sample.
Figure 15:
FIG. 15 illustrates a TEM cross-sectional image of YBCO film deposited on YSZ and $CeO_2$ buffered ISD MgO on HC substrate.
Figure 16A:
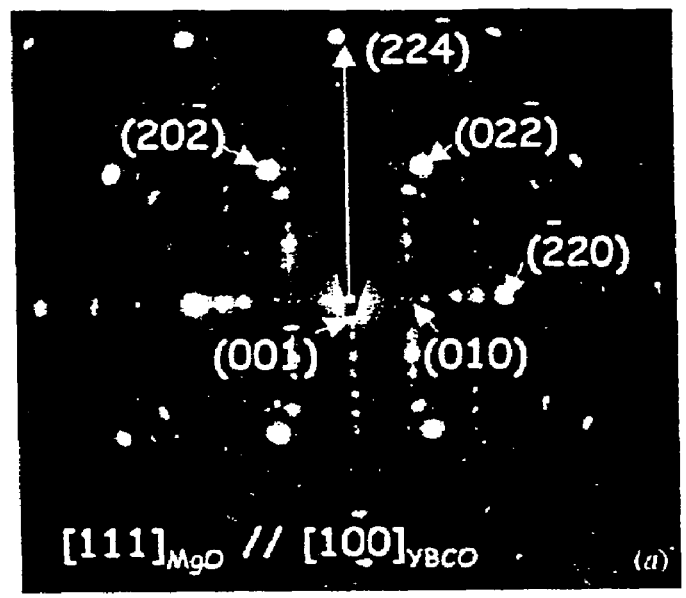
FIG. 16(a) is an illustration of a TEM selected area diffraction along MgO [111] zone axis between YBCO and MgO films.
Figure 16B:
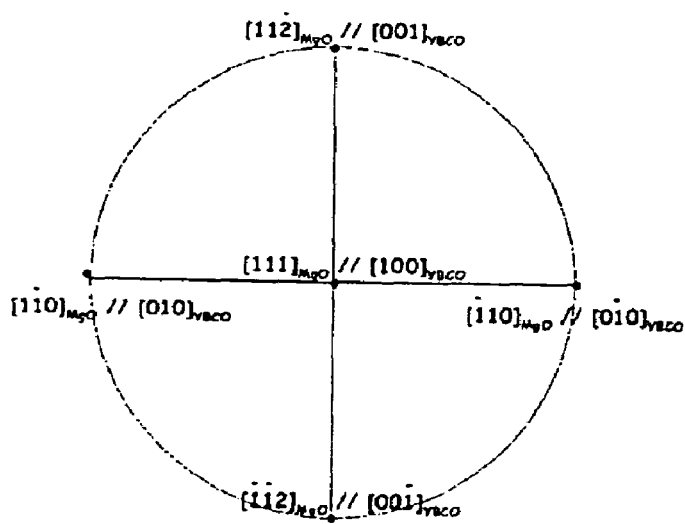
FIG. 16(b) is an illustration of a stereograph projection showing orientation relationship between YBCO and MgO films.

$CeO_2$ has a very close lattice match when compared with a YBCO pseudo cell, and the unit cell for the YBCO is larger than that for the $CeO_2$. Therefore, the $CeO_2$ X-ray diffraction peaks are overlaid with YBCO peaks, and it is difficult to analyze the crystalline texture of the $CeO_2$ layer after deposition of a YBCO film. Since the YSZ and $CeO_2$ layers were epitaxially grown on the MgO template before the deposition of YBCO film, their crystalline texture should not change after deposition of YBCO. Hence, we tried to analyze the orientation relationship between the YBCO film and the MgO template layer. The YBCO (005) pole figure shown in FIG. 14(a) has a single pole at the center. The YBCO (103) pole figure has four evenly distributed poles as shown in FIG. 14(b). This again confirmed the c-axis normal orientation in YBCO films deposited on YSZ and $CeO_2$ buffered ISD MgO substrates. Furthermore, YBCO films were biaxially textured. MgO (002) and MgO (220) pole figures measured on the same sample were plotted in FIGS. 14(c) and 14(d) as references. The YBCO and MgO films were biaxially textured, and so were the YSZ and $CeO_2$ films. We observed a unique orientation relationship between them. From the relative positions of their poles, we derived the following orientation relationship: YBCO<100>‖MgO<111> and YBCO<010>‖MgO<110>. FWHMs of 12° and 9° were measured from YBCO (103) and MgO (220) φ-scans, respectively. FIG. 15 shows the TEM cross-sectional image of YBCO deposited on YSZ and $CeO_2$ buffered ISD MgO on HC substrate. Layer thickness for YSZ and $CeO_2$ are both ≈100 nm in the sample shown in FIG. 13(a)–(b); this sample was used for selected area electron diffraction analysis. Selected area diffraction along the MgO and YSZ [111] zone axis is shown in FIG. 16(a) A stereograph projection, shown in FIG. 16(b), revealed orientation relationships between the YBCO and ISD MgO films. TEM results confirmed the orientation relationship between YBCO and MgO that was derived from X-ray pole figure analysis, with YBCO<100>‖MgO<111> and YBCO<010>‖MgO<110> or YBCO<001>‖MgO<112>. YBCO coated conductors fabricated by ISD MgO architecture exhibited a sharp superconducting transition with $T_c$=91 K. Transport $J_c$=1.2×10$^6$/cm$^2$ at 77 K in self-field was measured on a sample that was 0.40-μm thick, 4-mm wide, and 1-cm long.

It is seen, therefore, that biaxially textured MgO films were successfully grown by the ISD method, which is much more time efficient (10–20 times faster) for fabrication of buffer layers than is the IBAD YSZ process. MgO films grown by the ISD process contained columnar grains that were terminated at the surface by (002) planes. Plan-view SEM revealed a roof-tile structure. The surface roughness and biaxial texture of the ISD MgO thin films were significantly improved by deposition of an additional thin layer of MgO at elevated temperature. FWHMs of 9.2 and 5.4° were observed in the MgO (002) φ-scan and ω-scan, respectively. Texture in the ISD MgO films developed rapidly in the first 0.5-μm film growth, and then stabilized at FWHM ≈9° when the films grew thicker. $CeO_2$ and YSZ buffer layers were epitaxially grown on ISD MgO templates by PLD. Surface roughness was further improved after deposition of YSZ and $CeO_2$ buffer layers. YBCO films deposited on YSZ and $CeO_2$ buffered ISD MgO substrates were biaxially textured with 12° FWHM measured on YBCO (103). A unique orientation relationship, with YBCO<100>‖MgO<111> and YBCO<010>‖MgO<110>, was observed between the YBCO films and ISD MgO template layers. YBCO coated conductors fabricated by ISD MgO architecture exhibited a sharp superconducting transition with $T_c$=91 K and transport $J_c$=1.2×10$^6$ A/cm$^2$ measured at 77 K in self-field.

Figure 3:
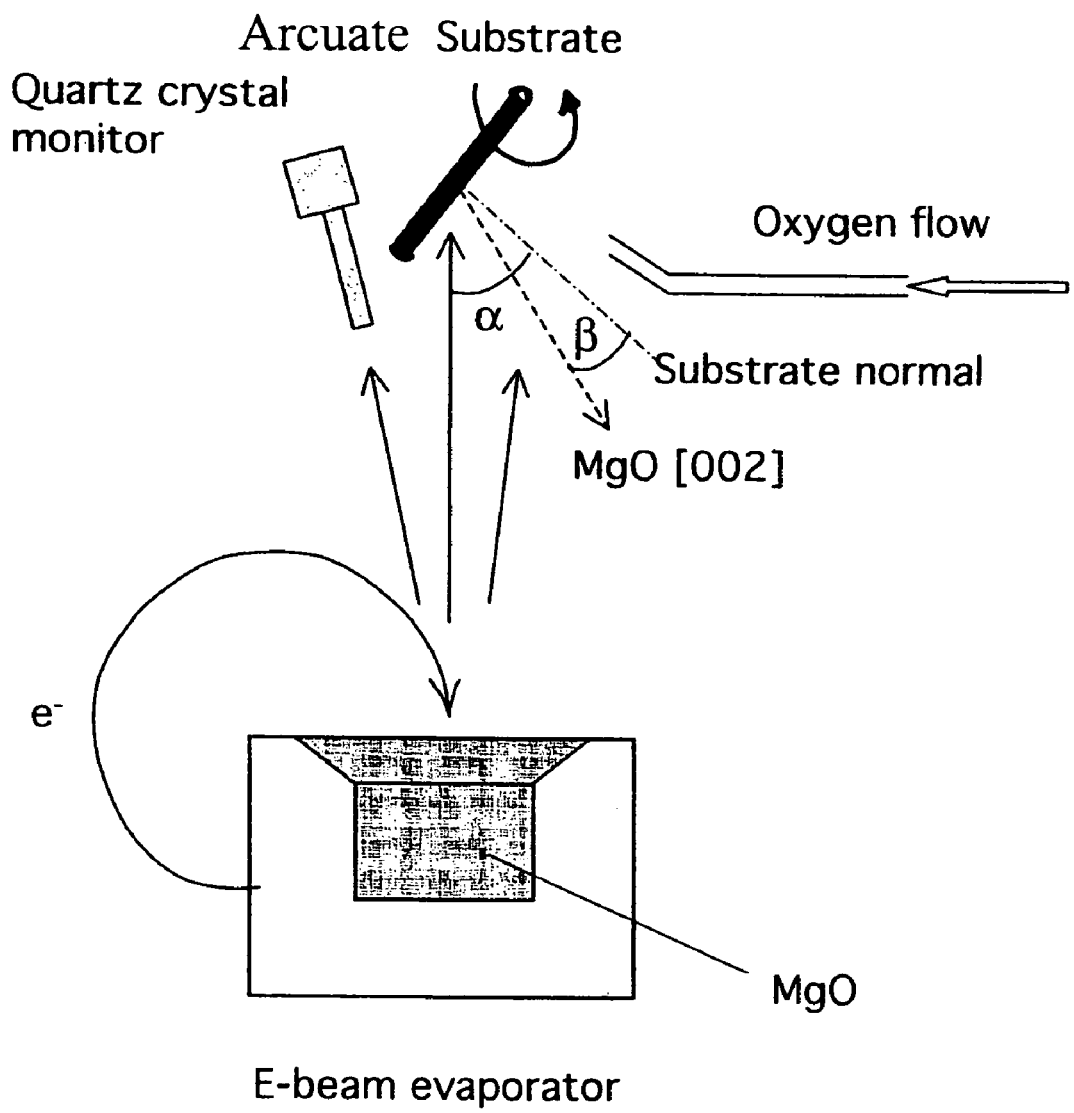
FIG. 3 is a schematic illustration of the ISD method applying magnesium oxide to a curved or arcuate surface.

Referring to FIG. 3, there is shown a self explanatory schematic of applying the layers to an arcuate surface. Although a cylinder is used for purposes of illustration, any curved surface may be coated. Relative rotation between the source of ions and the substrate is provided by rotating either the substrate or ion source or both.

The biaxially textured MgO layer is preferably deposited directly in contact with the substrate, which may or may not be biaxially textured. The c-axes of the MgO layer are inclined up to about 40° to the substrate normal, preferable about 10° to about 40°, with respect to the substrate normal, but most preferably from about 20° to about 35°. The substrate may be flat (planar) such as a tape or arcuate, such as a wire. The MgO crystalline layer may be up to about 2 microns thick, the YSZ or $Y_2O_3$ layer up to about 1 micron thick and the $CeO_2$ layer up to about 30 nanometers thick. When measuring the angle of the c-axes with respect to a curved surface, the angle refers to the angle between the normal to a tangent to the arcuate surface at the point of intersection.

Figure 17:
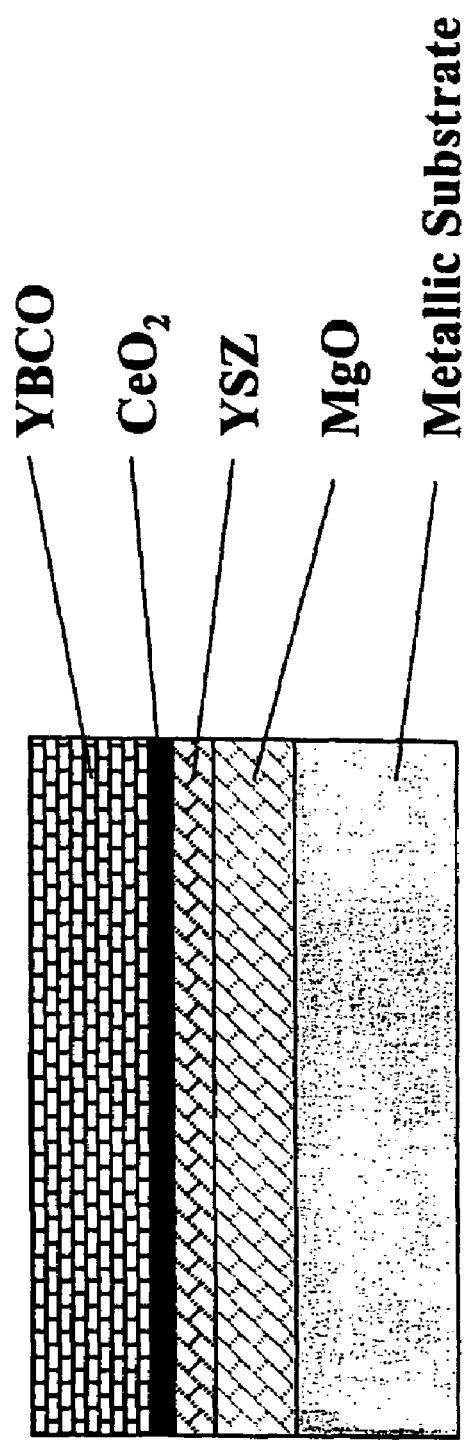
FIG. 17 is a illustration of the architecture of a YBCO superconductor deposited on an ISD MgO platform.

FIG. 17 shows the architecture of the article of the present invention comprised of separate layers. Although illustrated in planar form, the architecture may be arcuate as previously described.

While there has been disclosed what is considered to be the preferred embodiments of the present invention, it is understood that various changes in the details may be made without departing from the spirit, or sacrificing any of the advantages of the present invention.

The embodiments of the invention in which an exclusive property or privilege is claimed are defined as follows:

1. A layered article of manufacture, comprising a substrate; a biaxially textured MgO crystalline layer having the c-axes thereof inclined with respect to the plane of the substrate; a layer of one or more of YSZ or $Y_2O_3$; a layer of $CeO_2$; and a crystalline superconductor layer, said crystalline superconductor having the c-axes thereof normal to said substrate.

2. The article of manufacture of claim 1, wherein said substrate is metallic or a ceramic.

3. The article of manufacture of claim 2, wherein said biaxially textured MgO layer is directly in contact with said metallic substrate and the c-axes of said MgO layer are inclined up to about 40° from said metallic substrate normal.

4. The article of manufacture of claim 3, wherein the c-axes of said MgO layer are inclined between about 20° and about 35° with respect to said substrate normal.

5. The article of manufacture of claim 3, wherein said YSZ layer is directly in contact with said biaxially textured MgO layer and substantially coextensive therewith.

6. The article of manufacture of claim 5, wherein said $CeO_2$ layer is directly in contact with said YSZ layer and substantially coextensive therewith.

7. The article of manufacture of claim 6, wherein said crystalline superconductor layer is directly in contact with said $CeO_2$ layer and is selected from the family of YBCO superconductors.

8. The article of manufacture of claim 7, wherein said metallic substrate is a Ni alloy.

9. The article of manufacture of claim 8, wherein said metallic substrate is non-biaxially aligned.

10. The article of manufacture of claim 1, wherein said substrate is a tape.

11. The article of manufacture of claim 1, wherein said substrate is arcuate.

12. The article of manufacture of claim 11, wherein said substrate is a wire.

13. A layered article of manufacture, comprising a metallic substrate; a biaxially textured MgO crystalline layer on said metallic substrate, said MgO having the c-axes thereof inclined with respect to the normal to the substrate in the range of from about 10° to about 40°; a layer of one or more of YSZ or $Y_2O_3$ on said MgO crystalline layer; a layer of $CeO_2$ on said layer of one or more of YSZ or $Y_2O_3$; and a crystalline superconductor layer on said $CeO_2$ layer, said crystalline superconductor having the c-axes thereof normal to said metallic substrate.

14. The article of claim 13, wherein said biaxially textured MgO crystalline layer is up to about 2 microns thick.

15. The article of claim 13, wherein said YSZ or $Y_2O_3$ layer is up to about 1 micron thick.

16. The article of claim 13, wherein said $CeO_2$ layer is up to about 30 nanometers thick.

17. The article of claim 13, wherein said crystalline superconductor is selected from the family of YBCO superconductors.

18. The article of claim 13, wherein said substrate is arcuate.

19. The article of claim 13, wherein said biaxially textured MgO crystalline layer is directly in contact with said metallic substrate and having a homoepitaxial layer of MgO thereon and said YSZ layer in contact with said homoepitaxial layer of MgO and is up to about 2 microns thick, said YSZ layer is in direct contact with said $CeO_2$ layer and is up to about 1 micron thick, said $CeO_2$ layer is in direct contact with said superconductor layer and is up to about 30 nanometers thick, and said crystalline superconductor is selected from the family of YBCO superconductors.

20. The article of claim 19, wherein the c-axes of said crystalline MgO layer are inclined from about 20° to about 35° with respect to the normal to said metallic substrate.

21. The article of claim 13, wherein said article is a tape.

22. The article of claim 13, wherein said article is a wire.

* * * * *